(12) United States Patent
Oguma

(10) Patent No.: US 7,851,137 B2
(45) Date of Patent: Dec. 14, 2010

(54) METHOD OF MANUFACTURING SEMICONDUCTOR DEVICE

(75) Inventor: Hideki Oguma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 173 days.

(21) Appl. No.: 11/515,834

(22) Filed: Sep. 6, 2006

(65) Prior Publication Data

US 2007/0072131 A1    Mar. 29, 2007

(30) Foreign Application Priority Data

Sep. 29, 2005    (JP)    ............................... 2005-285155

(51) Int. Cl.
*G03F 7/20*    (2006.01)
(52) U.S. Cl. .................. 430/313; 430/311; 430/323
(58) Field of Classification Search ........................ None
See application file for complete search history.

(56) References Cited

U.S. PATENT DOCUMENTS

| 5,976,968 | A | * | 11/1999 | Dai ............................. 438/622 |
| 6,010,829 | A | * | 1/2000 | Rogers et al. ............... 430/316 |
| 6,818,528 | B2 | * | 11/2004 | Mandelman et al. ........ 438/427 |
| 6,835,662 | B1 | | 12/2004 | Erhardt et al. |
| 2004/0229467 | A1 | | 11/2004 | Muto |
| 2005/0048410 | A1 | | 3/2005 | Tanaka |
| 2005/0123858 | A1 | * | 6/2005 | Ito et al. ...................... 430/312 |
| 2005/0164129 | A1 | * | 7/2005 | Minami ....................... 430/311 |

FOREIGN PATENT DOCUMENTS

| JP | 2002-55432 | 2/2002 |
| JP | 2002-359352 | 12/2002 |
| JP | 2004-342894 | 12/2004 |

OTHER PUBLICATIONS

Notification of Reasons for Rejection issued by the Japanese Patent Office on Aug. 13, 2010, for Japanese Patent Application No. 2005-285155, and English-language translation thereof.

* cited by examiner

*Primary Examiner*—Daborah Chacko Davis
(74) *Attorney, Agent, or Firm*—Finnegan, Henderson, Farabow, Garrett & Dunner, L.L.P.

(57) ABSTRACT

There are provided a semiconductor device manufacturing method including: forming a film to be processed above a substrate; forming a resist layer above the film to be processed; transferring a transfer pattern to the resist layer using a reticle including the transfer pattern having a space having a width that becomes narrower than a smallest processing space width when transferred to the resist layer; performing trimming processing on the resist layer including the transfer pattern as transferred; and patterning the film to be processed using the resist layer, on which the trimming processing has been performed, as a mask.

20 Claims, 8 Drawing Sheets

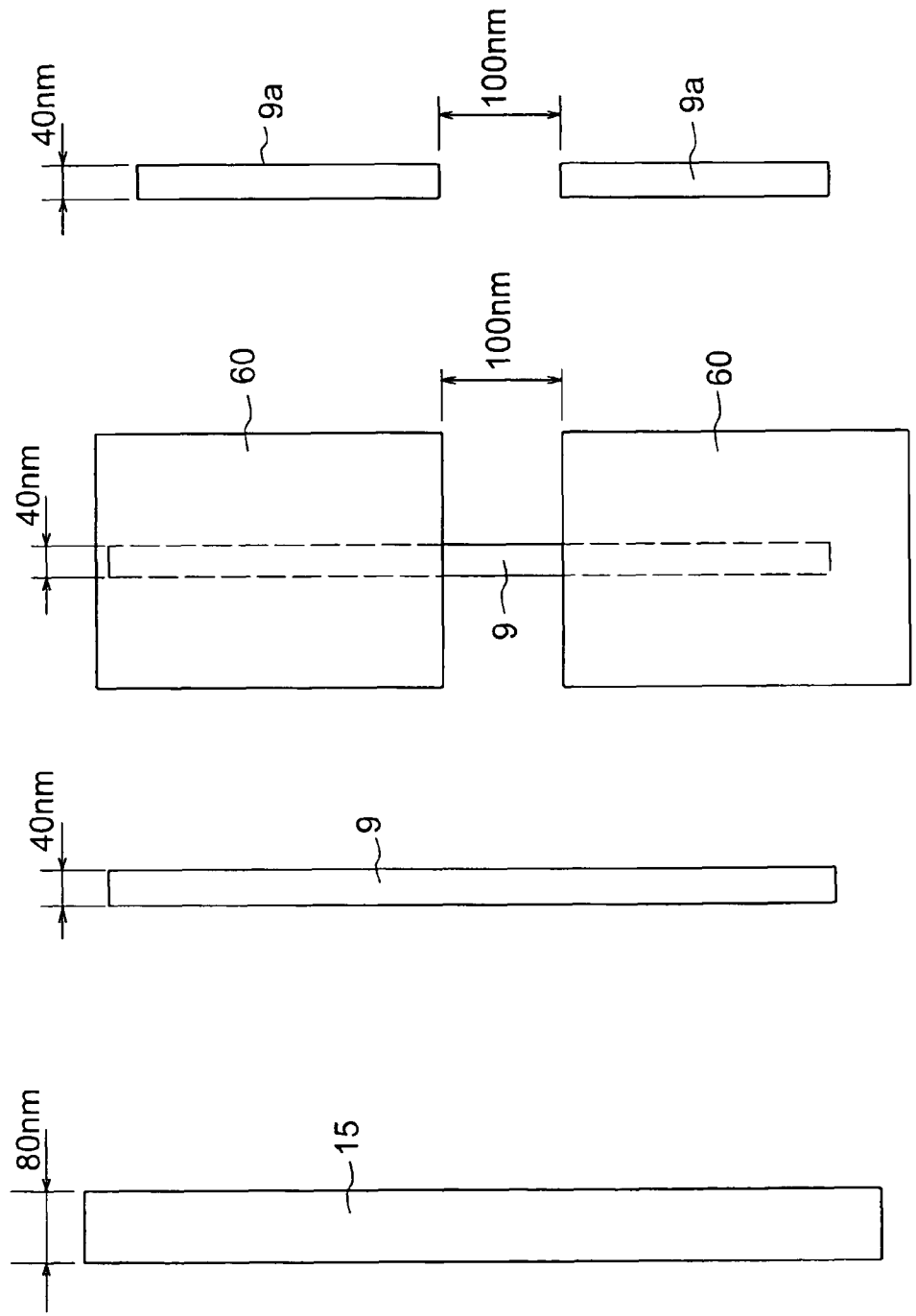

METHOD OF MANUFACTURING SEMICONDUCTOR DEVICE

CROSS-REFERENCE TO RELATED APPLICATION

This application is based upon and claims the benefit of priority from prior Japanese Patent Application No. 2005-285155, filed on Sep. 29, 2005 in Japan, the entire contents of which are incorporated herein by reference.

BACKGROUND OF THE INVENTION

1. Field of the Invention

The present invention relates to a method of manufacturing a semiconductor device.

2. Background Art

Recently, due to miniaturization of semiconductor devices, it is required to form a pattern including narrower lines than can be formed by lithography. In particular, although the gate electrode of a logic device requires a size of 40 nm or less, the limit of the exposing processing performed by a current ArF exposing device is about 70 nm. In order to solve this problem, a "trimming process" is employed, in which a resist pattern formed by a lithography process is trimmed by dry etching, thereby obtaining a miniaturized pattern. However, since the lines in the resist pattern are narrowed at a constant rate in this trimming process, the space portions are expanded. In order to obtain a desired space size, it is necessary to form narrower space portions in advance using a lithographic technique. However, since the required size is smaller than the limit of size that can be obtained by the lithographic technique, it is not possible to form a space portion with a sufficient sizing accuracy.

On the other hand, a technique is known in which in order to make an interval between floating gates smaller than the lithographic limit value (resolution limit value of an exposing device), an opening having a width corresponding to the lithographic limit value is formed in the resist, and this opening is uniformly shrunk using thermal flow deformation to use the shrunk width of the opening as the interval between floating gates (for example, Japanese Patent Laid-Open Publication No. 2004-342894).

In the technique disclosed in Japanese Patent Laid-Open Publication No. 2004-342894, a heat treatment step is required to make the floating gate interval smaller than the lithographic limit value, which increases the manufacturing costs. Furthermore, in this technique, it is not possible to make the gate size (gate length) smaller than the lithographic limit value.

Thus, the formation of a pattern having a size smaller than the limit size that can be made by lithography has a problem in that it is difficult to obtain both desirable line size and desirable space size.

SUMMARY OF THE INVENTION

A method of manufacturing a semiconductor device according to a first aspect of the present invention includes: forming a film to be processed above a substrate; forming a resist layer above the film to be processed; transferring a transfer pattern to the resist layer using a reticle including the transfer pattern having a space having a width that becomes narrower than a smallest processing space width when transferred to the resist layer; performing trimming processing on the resist layer including the transfer pattern as transferred; and patterning the film to be processed using the resist layer, on which the trimming processing has been performed, as a mask.

A method of manufacturing a semiconductor device according to a second aspect of the present invention includes: forming a film to be processed above a substrate; forming a resist layer above the film to be processed; forming a pattern on the resist layer, the pattern including an interim pattern of a space which does not reach a lower surface of the resist layer; performing trimming processing on the pattern of the resist layer including the interim pattern, thereby causing the space to reach the lower surface of the resist layer; and patterning the film to be processed using the pattern of the resist layer, on which the trimming processing has been performed, as a mask.

BRIEF DESCRIPTION OF THE DRAWINGS

FIGS. 11A to 11D are drawings for explaining comparative examples.

DESCRIPTION OF THE EMBODIMENTS

A method of manufacturing a semiconductor device according to an embodiment of the present invention will be described in detail below with reference to the accompanying drawings.

Figure 9:
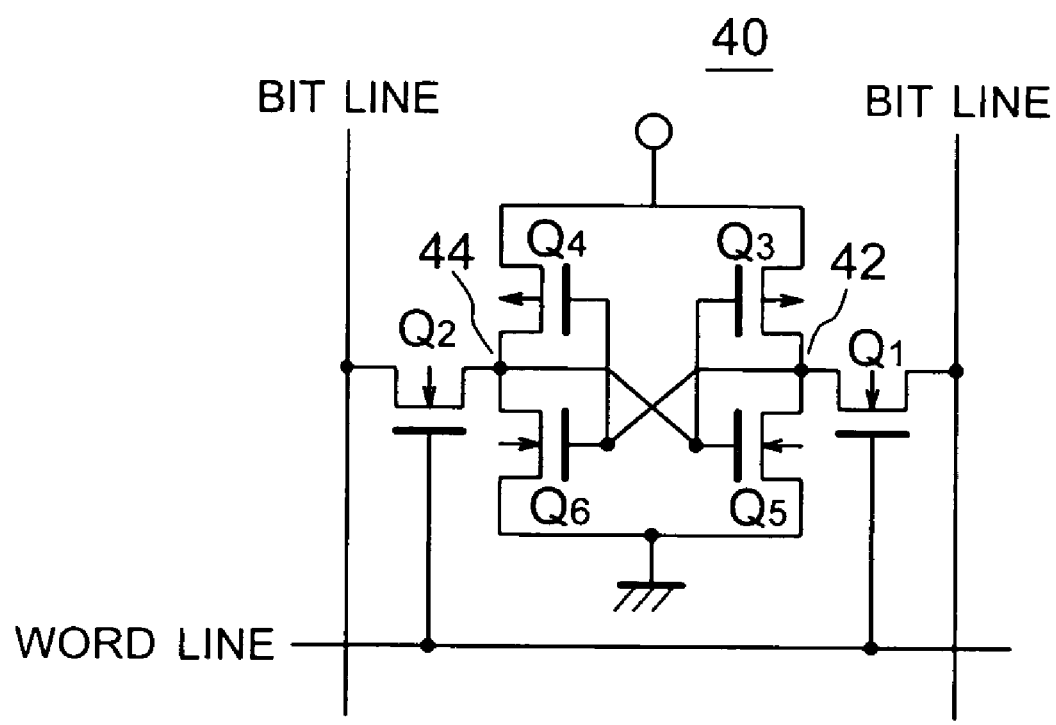
FIG. 9 is a circuit diagram showing a memory cell of an SRAM.

The manufacturing method of this embodiment is used to form gates of an SRAM, which has a plurality of memory cells, each including a flip-flop circuit as a basic circuit. For example, as shown in FIG. 9, each memory cell 40 includes p-type MOS transistors $Q_3$ and $Q_4$ and n-type MOS transistors $Q_1$, $Q_2$, $Q_5$, and $Q_6$. A first inverter circuit composed of the transistors $Q_3$ and $Q_5$ and a second inverter circuit composed of the transistors $Q_4$ and $Q_6$ are connected so as to constitute a flip-flop circuit. One of the source and the drain of the access transistor $Q_1$, to the gate of which a word line is connected, is connected to a node, i.e., a first memory node 42, which commonly connects the drains of the transistors $Q_3$ and $Q_5$ constituting the first inverter circuit. A first bit line is connected to the other of the source and the drain of the access transistor $Q_1$. Furthermore, one of the source and the drain of the access transistor $Q_2$, to the gate of which the aforementioned word line is connected, is connected to a node, i.e., a second memory node 44, which commonly connects the drains of the transistors $Q_3$ and $Q_5$ constituting the second inverter circuit. A second bit line which constitutes a pair with the first bit line is connected to the other of the source and the drain of the access transistor $Q_2$.

Each memory cell 40 transfers, i.e., reads and writes, data between the bit lines via the access transistor $Q_1$ and $Q_2$. The word line signal is a signal line for an output of a row decoder, which becomes a "1" level to turn on the access transistors $Q_1$ and $Q_2$ only when the memory cell 40 is selected. The first and the second bit lines are set at the same voltage level before the memory cell 40 is selected, so that the data of a previously selected memory cell is protected and not erroneously written to a newly selected memory cell. In a write cycle, data items transferred to the first and the second bit lines in response to the data of an accessed memory cell 40 are written to the memory cell 40 via the access transistors $Q_1$ and $Q_2$.

Figure 10:
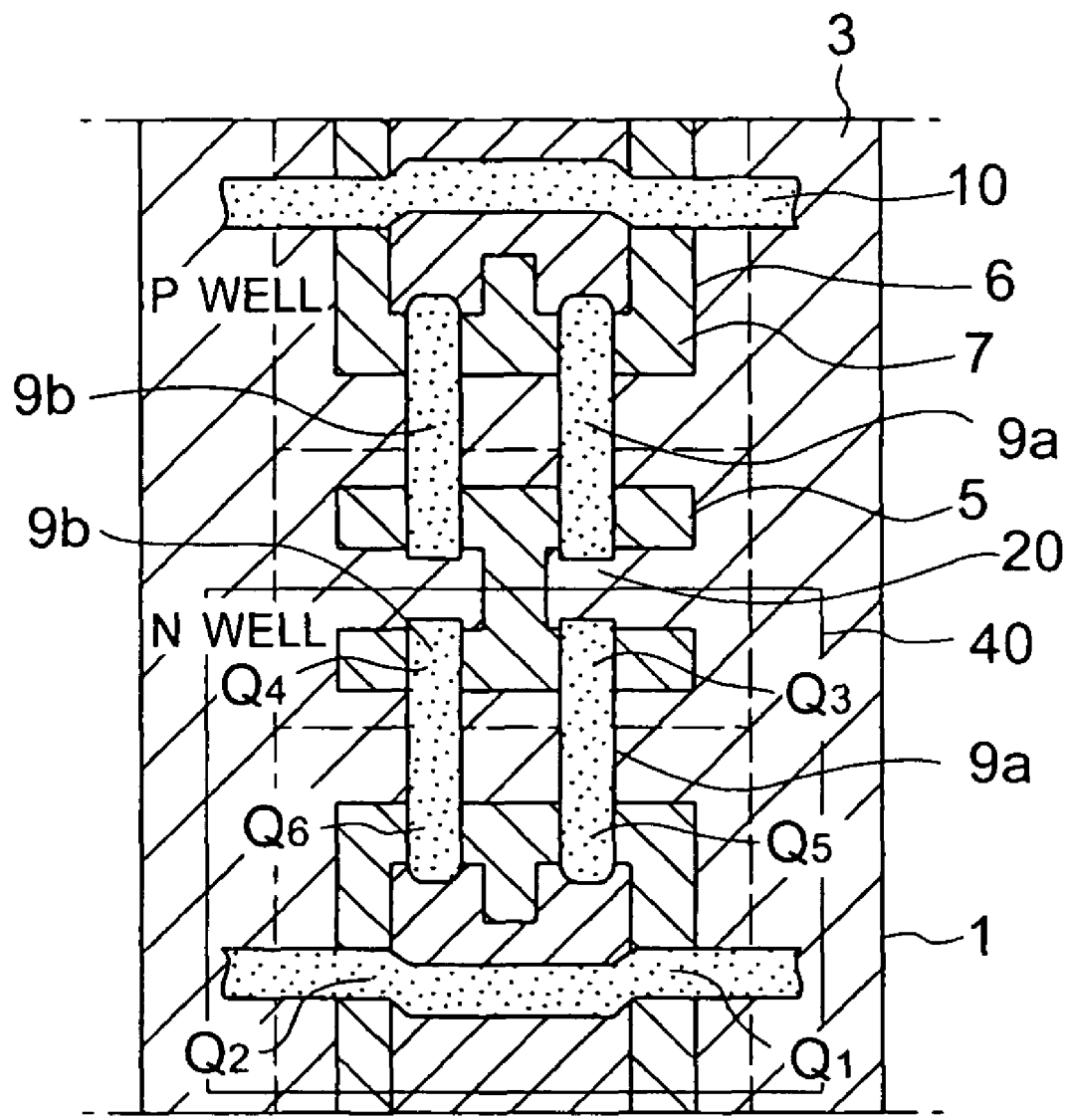
FIG. 10 is a layout diagram of the SRAM.

FIG. 10 shows an example of a plan view in which an SRAM includes two memory cells 40 shown in FIG. 9. A p-type well region and an n-type well region are formed in a semiconductor substrate 1, and element regions 5 and 6 which are isolated by an element isolation region 3 of an insulating film are formed in the p-type and the n-type well regions, respectively. The surfaces of these element regions 5 and 6 are covered by a gate insulating film 7. P-type MOS transistors $Q_3$ and $Q_4$ are formed in the element region 5 of the n-type well region, and n-type MOS transistors $Q_1$, $Q_2$, $Q_5$, and $Q_6$ are formed in the element region 6 of the p-type well region. The transistors $Q_3$ and $Q_5$ have a common gate 9a, and the transistors $Q_4$ and $Q_6$ have a common gate 9b. Furthermore, the gates of the access transistors $Q_1$, and $Q_2$ also serve as the word line 10. In the plan view of FIG. 10, the local wiring connecting the first and the second bit lines shown in FIG. 9, a power supply line, and the gate 9 of the transistors $Q_3$ and $Q_5$ to a common connection node (second memory node 44) of the transistors $Q_2$, $Q_4$, and $Q_6$ and the local wiring connecting the gate 9 of the transistors $Q_4$ and $Q_6$ to a common connection node (first memory node 42) of the transistors $Q_1$, $Q_3$, and $Q_5$ are not shown.

Figure 7:
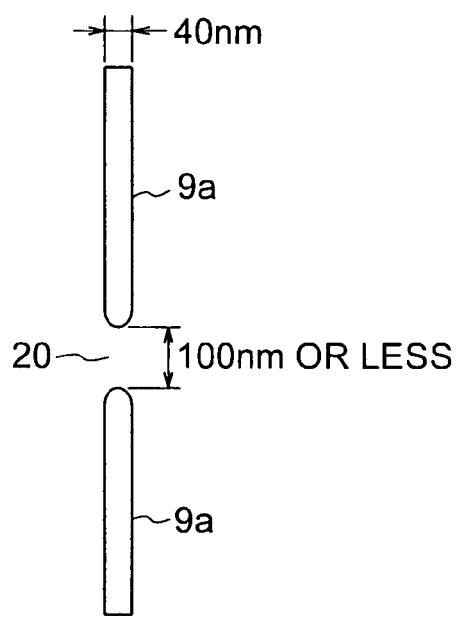
FIG. 7 is a plan view of gates formed by the method of manufacturing a semiconductor device according to the embodiment of the present invention.

In the manufacturing method according to this embodiment, the gate size (gate length) of the transistors constituting the flip-flop circuit of the adjacent memory cells 40 shown in FIG. 10 is made smaller than the lithographic limit value (smallest processing size), and the gate interval, e.g., the interval 20 of the gates 9a, 9a and 9b, 9b of the adjacent memory cell 40 is made smaller. For example, this method is used to form the gates 9a, 9a having a gate length of 40 nm and a gate interval 20 of 100 nm or less, as shown in FIG. 7.

Figure 1:
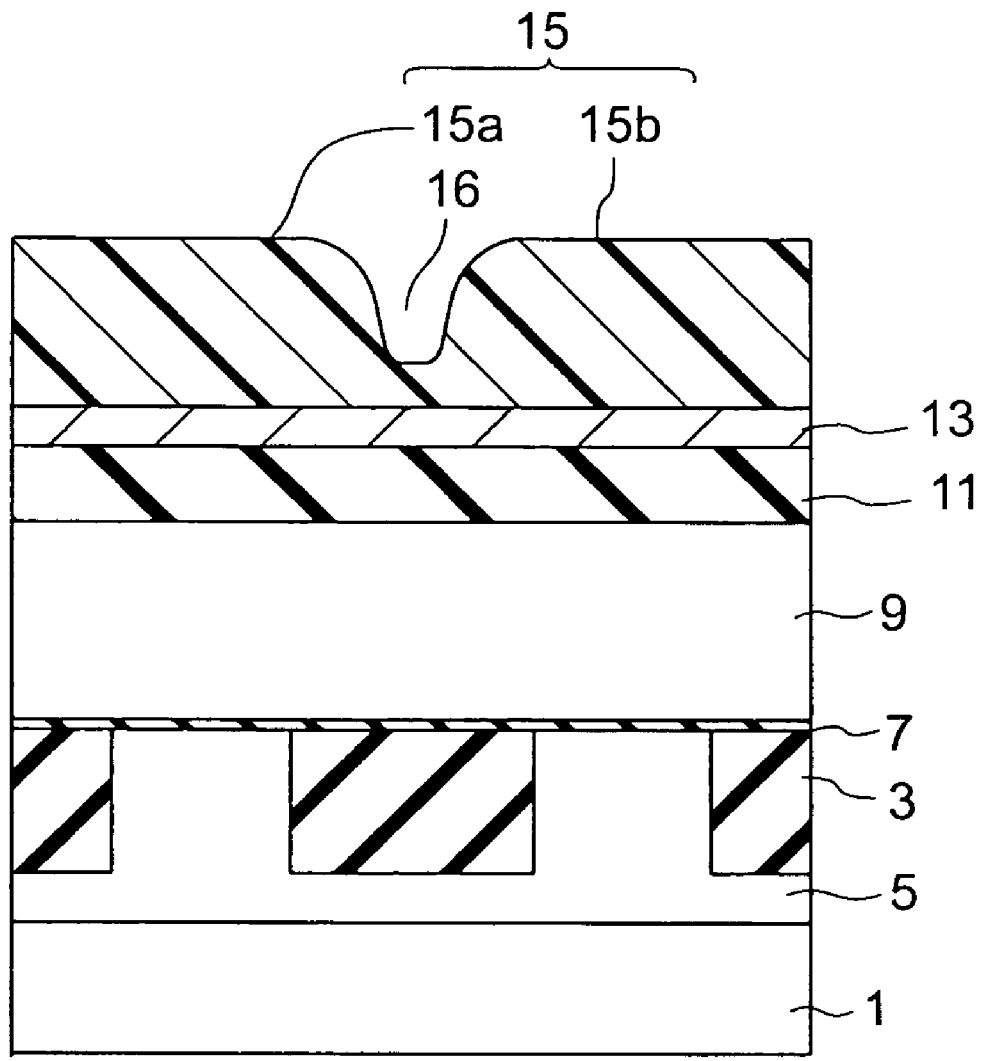
FIG. 1 is a sectional view of a step of a method of manufacturing a semiconductor device according to an embodiment of the present invention.

First, an n-type well region and a p-type well region are formed in a semiconductor substrate 1. Subsequently, as shown in FIG. 1, an element isolation region 3 is formed in these well regions to isolate the n-type well region and the p-type well region and to form an isolated element region 5 in the n-type well region and an isolated element region 6 in the p-type well region, respectively (FIG. 10). Thereafter, a gate insulating film 7 is formed to cover the respective element regions. Subsequently, a polycrystalline silicon film 9 serving as a gate electrode is formed on the gate insulating film 7. After a TEOS (Tetra Ethyl Ortho Silicate) layer 11 is formed on the polycrystalline silicon film 9, a reflection prevention layer 13 is formed on the TEOS layer 11. The reflection prevention layer 13 is used to prevent the reflection of light from the lower surface at the time of the exposing processing, thereby forming a minute pattern. Thereafter, a resist is applied to the reflection prevention layer 13 to form a resist layer 15.

Figure 3:
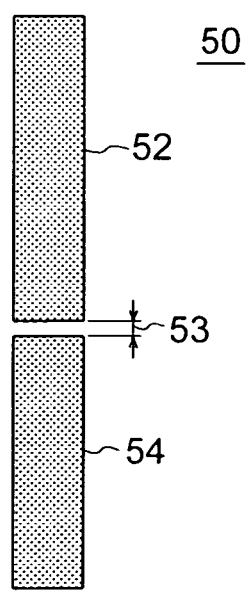
FIG. 3 is a plan view of a reticle used in the method of manufacturing a semiconductor device according to the embodiment of the present invention.

Then, as shown in FIG. 3, a reticle 50 is prepared including pattern lines 52 and 54 and a space 53 between the pattern lines 52 and 54. The pattern lines 52 and 54 have the gate pattern size of 80 nm and the space 53 has the space width which is less than the photolithographic limit value (smallest processing space width) (e.g., 90 nm) when transferred to the resist layer 15 by being subjected to the exposure and development processing. In this example, the actual size of the portion corresponding to the space 53, which is transferred to the resist layer 15 after the exposure and development processing is about 54 nm, which is 0.6 times the smallest processing space width (90 nm). The pattern lines 52 and 54 correspond to gates 9a, 9a shown in FIG. 10. Generally, the smallest processing space width between the pattern lines changes in accordance with the line width of the pattern lines formed at the same time. Since the photolithographic limit line width (smallest processing line width) is about 80 nm, the pattern lines 52 and 54 are transferred to the resist layer 15 after the exposure and development processing with a sufficient size conversion accuracy.

Figure 2:
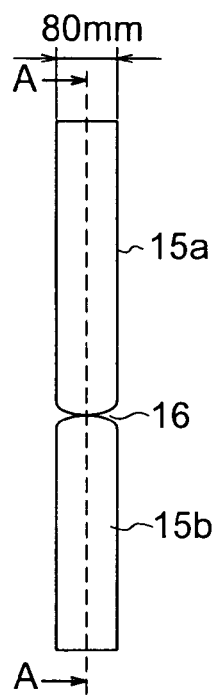
FIG. 2 is a plan view of resist pattern lines formed by the method of manufacturing a semiconductor device according to the embodiment of the present invention.

When the resist layer 15 is exposed to light and developed using the reticle 50, since the space of the resist layer 15 formed by transferring the space 53 of the reticle 50 is narrower than the smallest processing space width, the pattern is not transferred to the resist during the exposure and development processing with a sufficient size conversion accuracy. As a result, as shown in FIGS. 1 and 2, an opening 16, which is in a halfway state and the bottom of which does not reach the reflection prevention layer 13, is formed to constitute an interim pattern. On the other hand, the pattern lines 52 and 54 of the reticle 50 become resist pattern lines 15a and 15b having a resist pattern size of 80 nm, respectively. However, since the bottom of the opening 16 does not reach the reflection prevention layer 13, the resist pattern line 15a and the resist pattern line 15b are connected with each other. FIG. 1 is a sectional view taken along line A-A of FIG. 2.

Figure 4:
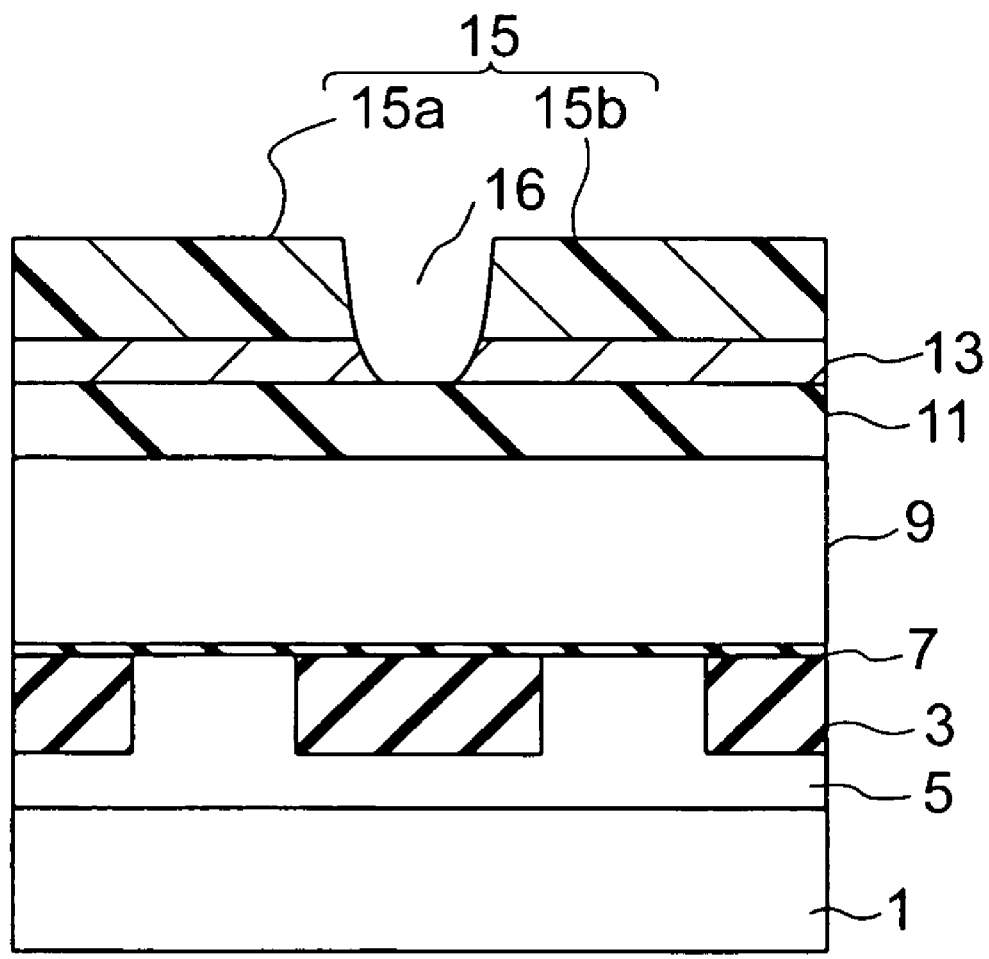
FIG. 4 is a sectional view of a step of the method of manufacturing a semiconductor device according to the embodiment of the present invention.

Next, dry etching is performed using an etching gas, e.g., $O_2$ gas or a mixed gas containing HBr and $O_2$ to perform trimming processing on the resist pattern lines 15a and 15b. As a result, the bottom of the opening 16 reaches the reflection prevention layer 13, resulting in that the resist pattern lines 15a and 15b having been connected with each other are separated from each other, and the resist pattern size at one side is reduced by 20 nm to make the total size 40 nm. The size of the opening 16 at the surface portion of the resist pattern lines 15a and 15b is increased by 20 nm at one side to make the total size 94 nm, but the size at the lower portion, at which the resist pattern lines 15a and 15b are separated as a result of the trimming processing, is about 70 nm to 80 nm. Then, the reflection prevention layer 13 is patterned by RIE (Reactive Ion Etching) using the separated resist pattern lines 15a and 15b as masks, thereby exposing the TEOS layer 11 at the bottom portion of the opening 16 (FIG. 4).

Figure 5:
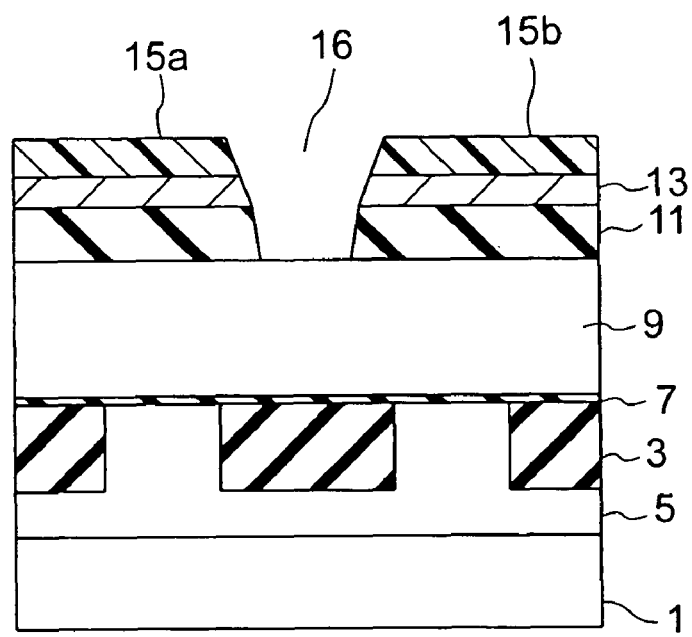
FIG. 5 is a sectional view of a step of the method of manufacturing a semiconductor device according to the embodiment of the present invention.
Figure 6:
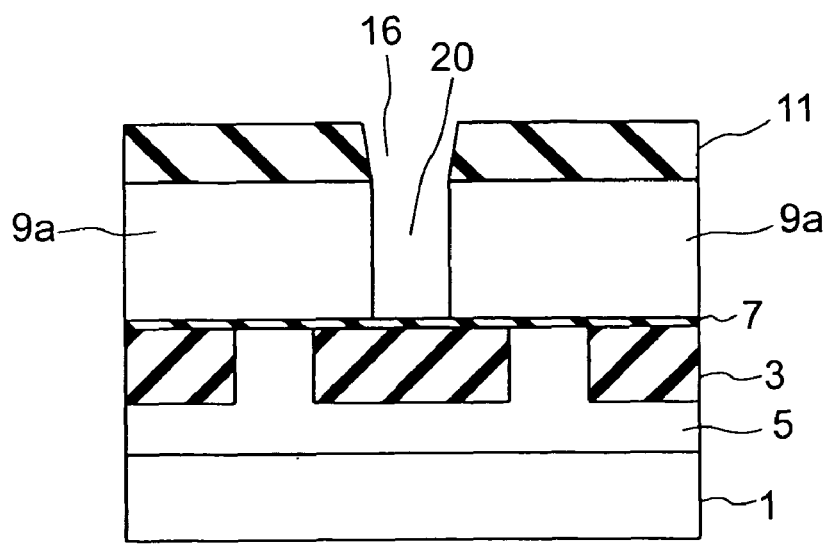
FIG. 6 is a sectional view of a step of the method of manufacturing a semiconductor device according to the embodiment of the present invention.

Subsequently, as shown in FIG. 5, the TEOS layer 11 is patterned using, as masks, the separated resist pattern lines 15a and 15b. Then, after the resist pattern lines 15a and 15b and the reflection prevention layer 13 are removed, the polycrystalline silicon film 9 is patterned using, as a mask, the TEOS layer 11 as patterned, thereby obtaining gates 9a, 9a (FIG. 6). Thereafter, the TEOS layer 11 is removed, and the gates 9a, 9a having a gate size (gate length) of 40 nm and a gate interval of 100 nm or less are left, as shown in FIG. 7.

Figure 8:
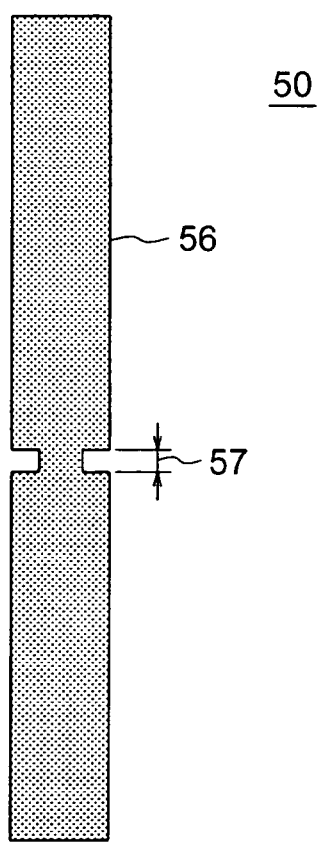
FIG. 8 is a plan view of a reticle used in the method of manufacturing a semiconductor device according to the embodiment of the present invention.

As shown in FIG. 3, a space which becomes narrower than the smallest processing space width when transferred, i.e., a slit 53, is provided to the reticle 50 in this embodiment. However, the same effect can be obtained by providing a pattern 56 including a notch 57, which becomes narrower than the smallest processing space width when transferred to the reticle 50, as shown in FIG. 8. In both the cases, it is preferable that the width of the portion of the slit or notch be set so that the width becomes 0.6 to 0.9 times the smallest processing space width when transferred to the resist layer. If the width of such a portion is set so that the width after the transfer processing becomes less than 0.6 times the smallest processing space width, it is difficult to make an opening, the bottom of which does not reach the resist layer, by the transfer processing. If the width is set so that the width after the transfer processing exceeds 0.9 times the smallest processing space width, the space is transferred to the resist layer with a sufficient size conversion accuracy. Accordingly, it is possible that the space width is extremely widened at the time of the trimming of the resist layer.

Comparative Example

Next, a comparative example of this embodiment will be described with reference to FIGS. 11A to 11D. The steps of the comparative example are the same as those of this embodiment until the resist layer 15 is applied. Thereafter, a resist pattern line 15 having a line width of 80 nm is formed by using a photolithographic technique (FIG. 11A). Subsequently, trimming processing is performed on the resist pattern line 15 to form a resist pattern line having a line width of 40 nm, which is used as a mask when the reflection prevention layer and the TEOS layer located below this resist pattern lines are patterned. Thereafter, the resist pattern line is peeled off and the reflection prevention layer is removed. Subsequently, the polycrystalline silicon film 9 is patterned using the patterned TEOS layer as a mask, and the TEOS layer is removed, thereby obtaining a gate pattern line 9 having a gate size of 40 nm, as shown in FIG. 11B.

Subsequently, a TEOS layer, a reflection prevention layer, and a resist layer are sequentially formed again to cover the gate pattern line, and resist pattern lines 60, 60 having a space width of 100 nm are formed as shown in FIG. 11C. After the reflection prevention layer and the TEOS layer are patterned using the resist pattern lines 60, 60 as a mask, the resist pattern lines 60, 60 and the reflection prevention layer are removed. Then, after the gate pattern line 9 is patterned using the patterned TEOS layer as a mask, the TEOS layer is removed, thereby forming gates 9a, 9a having a gate size of 40 nm and a gate interval of 100 nm, as shown in FIG. 11D.

In another comparative example, after the trimming processing is performed on the resist pattern line 15, the resist pattern line obtained can be used as a mask to pattern the reflection prevention layer and the TEOS layer located below this resist pattern line. Thereafter, the resist pattern line is peeled off and the reflection prevention layer is removed. Subsequently, a reflection prevention layer and a resist layer are sequentially formed again, and resist pattern lines 60, 60 having a space width of 100 nm are formed as shown in FIG. 11C. Then, the TEOS layer is etched using the resist pattern lines 60, 60 as masks. Thereafter, the resist pattern lines 60, 60 and the reflection prevention layer are removed, the polycrystalline silicon film 9 is patterned using the TEOS layer that is exposed at the surface as a mask, and the TEOS layer is removed, thereby obtaining a gate pattern line 9 having a gate size of 40 nm, as shown in FIG. 11D.

Although gates having a desired size can be obtained in these comparative examples, the lithography step should be performed two times. As a result, in the process of these comparative examples, a problem arises in that the first pattern and the second pattern may not match each other, and the manufacturing steps may increase, thereby increasing the manufacturing cost as compared with this embodiment.

Although the patterning of gates is the issue of this embodiment, a very narrow space can be formed as well by providing a space, which is not transferred to a resist with a sufficient size conversion accuracy, i.e., which is narrower than the smallest processing space width, to the reticle and by performing a trimming process.

According to the embodiments of the present invention, it is possible to decrease the pattern size to the level smaller than the lithographic limit, and to decrease the interval between the patterns.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

The invention claimed is:

1. A method of manufacturing a semiconductor device comprising:
    forming a film to be processed above a substrate;
    forming a resist layer above the film to be processed;
    transferring a first pattern to the resist layer to form a second pattern, which corresponds to the first pattern, in the resist layer by using a reticle, the reticle including the first pattern, the first pattern comprising first two pattern lines in line and a first space between the first two pattern lines, the first two pattern lines being transferred to second two pattern lines in line in the second pattern, the first space being transferred to a second space between the second two pattern lines in the second pattern, the second space having a space width narrower than a smallest processing space width;
    performing trimming processing on the resist layer including the second pattern to thereby increase the space width of the second space in the second pattern; and
    patterning the film to be processed using the resist layer, on which the trimming processing has been performed, as a mask.

2. The method of manufacturing a semiconductor device according to claim 1, wherein the second space in the second pattern is a portion that does not reach a lower surface of the resist layer.

3. The method of manufacturing a semiconductor device according to claim 1, wherein the space width of the second space is 0.6 to 0.9 times the smallest processing space width.

4. The method of manufacturing a semiconductor device according to claim 1, wherein the first space of the first pattern of the reticle is in a shape of a slit.

5. The method of manufacturing a semiconductor device according to claim 1, wherein the first space of the first pattern of the reticle is in a shape of a notch formed by cutting a part of the first pattern.

6. The method of manufacturing a semiconductor device according to claim 1, wherein the first pattern corresponds to a gate pattern of MOS transistors constituting a memory cell of an SRAM, and the first space of the first pattern of the reticle forms an interval between gates of adjacent memory cells.

7. The method of manufacturing a semiconductor device according to claim 1, wherein a reflection prevention layer is provided between the film to be processed and the resist layer, and after the trimming processing is performed, an opening is formed in a region of the reflection prevention layer corresponding to the second space, at a bottom of which the film to be processed is exposed.

8. The method of manufacturing a semiconductor device according to claim 1, wherein a gate electrode material film is provided between the film to be processed and the substrate, and after the patterning of the film to be processed is performed, the resist layer is removed and patterning of the gate electrode material film is performed using the patterned film to be processed as a mask.

9. The method of manufacturing a semiconductor device according to claim 8, wherein the first pattern corresponds to a gate pattern formed during the patterning of the gate electrode material film, and has a line width equal to or more than a smallest processing line width when pattern-transferred to the resist layer.

10. The method of manufacturing a semiconductor device according to claim 9, wherein during the trimming processing, a line width of the gate pattern is narrowed to be less than the smallest processing line width.

11. The method of manufacturing a semiconductor device according to claim 8, wherein an element isolation region is provided to the substrate, and during the patterning of the gate electrode material film, an interval between adjacent gates corresponding to the first space is formed above the element isolation region.

12. A method of manufacturing a semiconductor device comprising:
    forming a film to be processed above a substrate;
    forming a resist layer above the film to be processed;
    forming a pattern in the resist layer, the pattern including two pattern lines in line and an interim pattern of a space which does not reach a lower surface of the resist layer, the space being between the two pattern lines;
    performing trimming processing on the pattern of the resist layer including the interim pattern, thereby causing the space to reach the lower surface of the resist layer; and
    patterning the film to be processed using the pattern of the resist layer, on which the trimming processing has been performed, as a mask.

13. The method of manufacturing a semiconductor device according to claim 12, wherein the space in the interim pattern has a width 0.6 to 0.9 times a smallest processing space width.

14. The method of manufacturing a semiconductor device according to claim 12, wherein the space is in a shape of a slit.

15. The method of manufacturing a semiconductor device according to claim 12, wherein the space is in a shape of a notch.

16. The method of manufacturing a semiconductor device according to claim 12, wherein a reflection prevention layer is provided between the film to be processed and the resist layer, and after the trimming processing is performed, an opening is formed in a region of the reflection prevention layer corresponding to the space, at a bottom of which the film to be processed is exposed.

17. The method of manufacturing a semiconductor device according to claim 12, wherein a gate electrode material film is provided between the film to be processed and the substrate, and after the patterning of the film to be processed is performed, the resist layer is removed and patterning of the gate electrode material film is performed using the patterned film to be processed as a mask.

18. The method of manufacturing a semiconductor device according to claim 17, wherein the pattern of the resist layer including the interim pattern corresponds to a gate pattern formed during the patterning of the gate electrode material film, and has a width equal to or more than a smallest processing line width.

19. The method of manufacturing a semiconductor device according to claim 18, wherein during the trimming processing, a line width of the gate pattern is narrowed to be less than the smallest processing line width.

20. The method of manufacturing a semiconductor device according to claim 17, wherein an element isolation region is provided to the substrate, and during the patterning of the gate electrode material film, an interval between adjacent gates corresponding to the space is formed above the element isolation region.

* * * * *